(12) United States Patent
Liu et al.

(10) Patent No.: US 9,075,194 B2
(45) Date of Patent: Jul. 7, 2015

(54) METHOD FOR MANUFACTURING HOLOGRAPHIC BI-BLAZED GRATING

(71) Applicant: Soochow University, Jiangsu (CN)

(72) Inventors: Quan Liu, Jiangsu (CN); Jianhong Wu, Jiangsu (CN); Minghui Chen, Jiangsu (CN)

(73) Assignee: SOOCHOW UNIVERSITY, Jiangsu (CN)

( * ) Notice: Subject to any disclaimer, the term of this patent is extended or adjusted under 35 U.S.C. 154(b) by 0 days.

(21) Appl. No.: 14/352,783

(22) PCT Filed: Oct. 10, 2012

(86) PCT No.: PCT/CN2012/082674
§ 371 (c)(1),
(2) Date: Aug. 29, 2014

(87) PCT Pub. No.: WO2013/056627
PCT Pub. Date: Apr. 25, 2013

(65) Prior Publication Data
US 2015/0048047 A1 Feb. 19, 2015

(30) Foreign Application Priority Data
Oct. 19, 2011 (CN) .......................... 2011 1 0318455

(51) Int. Cl.
*G03F 7/00* (2006.01)
*G02B 5/18* (2006.01)
(Continued)

(52) U.S. Cl.
CPC ............ *G02B 5/1857* (2013.01); *G02B 5/1861* (2013.01); *G02B 5/18* (2013.01);
(Continued)

(58) Field of Classification Search
CPC .. G02B 5/1857; G02B 5/1861; G02B 5/1847; G02B 5/18; G02B 5/1842; G02B 5/203; G03H 2260/14; G03F 7/0005
See application file for complete search history.

(56) References Cited

U.S. PATENT DOCUMENTS

| 7,175,773 B1 * | 2/2007 | Heidemann et al. ............ 216/24 |
| 2002/0008912 A1 * | 1/2002 | Kleemann et al. ............ 359/569 |

(Continued)

FOREIGN PATENT DOCUMENTS

| CN | 101320207 A | 12/2008 |
| CN | 101726779 | 6/2010 |

(Continued)

OTHER PUBLICATIONS

International Search Report from PCT/CN2012/082674, dated Jan. 17, 2013.

(Continued)

*Primary Examiner* — Duy Deo
(74) *Attorney, Agent, or Firm* — Swanson & Bratschun, L.L.C.

(57) ABSTRACT

A method for manufacturing a holographic bi-blazed grating. Two blaze angles of the holographic bi-blazed grating are respectively a blaze angle A and a blaze angle B, and oblique-ion beam etching is performed on two grating areas A and B respectively by using a photoresist grating (12) and a homogeneous grating (14) as masks, thereby implementing different controls on the two blaze angles, and avoiding a secondary photoresist lithography process. Because when manufacturing the homogeneous grating (14), the time of positive ion beam etching can be controlled, so that the groove depth of the homogeneous grating (14) is controlled accurately. In addition, because the homogeneous grating mask and a substrate (10) are made of the same material, etching rates of the two are consistent, so that the accurate control of blaze angles can be implemented.

8 Claims, 7 Drawing Sheets

(51) Int. Cl.
*G02B 5/20* (2006.01)
*G02B 5/32* (2006.01)
*G03H 1/04* (2006.01)
*G03H 1/18* (2006.01)

(52) U.S. Cl.
CPC ............ *G02B 5/1842* (2013.01); *G02B 5/1847* (2013.01); *G03H 2260/14* (2013.01); *G02B 5/203* (2013.01); *G02B 5/32* (2013.01); *G03F 7/0005* (2013.01); *G03H 1/0402* (2013.01); *G03H 1/0476* (2013.01); *G03H 1/181* (2013.01); *G03H 1/182* (2013.01); *G03H 2001/0439* (2013.01)

(56) References Cited

U.S. PATENT DOCUMENTS

| | | | |
|---|---|---|---|
| 2002/0122255 A1 | 9/2002 | Ogusu et al. | |
| 2003/0124313 A1* | 7/2003 | Nagano et al. | 428/156 |
| 2006/0216478 A1* | 9/2006 | Nagano et al. | 428/156 |
| 2013/0105438 A1* | 5/2013 | Zhu et al. | 216/24 |
| 2014/0353141 A1* | 12/2014 | Liu et al. | 204/192.34 |

FOREIGN PATENT DOCUMENTS

| | | |
|---|---|---|
| CN | 101799569 | 8/2010 |
| CN | 102323634 | 1/2012 |
| CN | 102565905 | 7/2012 |
| JP | 56-043620 | 4/1981 |
| JP | 60-033501 | 2/1985 |
| JP | 2002-189112 | 7/2002 |
| WO | WO 2008/081555 | 7/2008 |

OTHER PUBLICATIONS

Hong, et al. (2008) Vacuum 45(3):25-27 "Development of plasma photoresist descum system for large-aperture diffraction gratings" (with English abstract).

Yang (2008) China Master's Theses Full Text Database, "Study on Characteristics of the Reaction Ion Beam Etching of Holographic Grating" (with English abstract).

Xu, et al. (2003) Vacuum Science and Technology (China) 23(5):362-372 "Application of Photoresist-Ashing to Diffraction Grating Fabrication by Holographic Ion Beam Etching" (with English abstract).

* cited by examiner

METHOD FOR MANUFACTURING HOLOGRAPHIC BI-BLAZED GRATING

RELATED APPLICATIONS

This application is a 35 U.S.C. §371 national phase application of PCT/CN2012/082674 (WO 2013/056627), filed on Oct. 10, 2012, entitled "Method for Manufacturing Holographic Bi-Blazed Grating", which application claims priority to Chinese Application No. 201110318455.4, filed Oct. 19, 2011, each of which is incorporated herein by reference in its entirety.

This application claims priority to Chinese patent application No. 201110318455.4 titled "METHOD FOR FABRICATING HOLOGRAPHIC BI-BLAZED GRATING" and filed on with the State Intellectual Property Office on Oct. 19, 2011 which is incorporated herein by reference in its entirety.

FIELD

The present disclosure relates to a method for fabricating a diffractive optical element, and in particular to a method for fabricating a holographic bi-blazed grating.

BACKGROUND

The grating is a key element widely used as a high efficient dispersive optical element, and it plays an important role in the optical instrumentation.

As well known, the direction of the main diffraction peak for a single slit is both the geometric optical propagation direction of the light and the direction of the zero order for the multi-slit grating. It is in the direction of the main diffraction peak for the single slit, where the light with various wavelengths concentrate. In practical application, it is tended that the light energy is concentrated on a specific order as far as possible. Therefore, it is necessary to fabricate a groove determined by a calculation, such that the direction of the main diffraction peak for a single slit (or the geometric optical propagation direction of light) is consistent with the direction of the predetermined diffraction order for the grating. In this case, most of the light energy may be concentrated on the predetermined diffraction order. The phenomenon is referred to as blaze, and the grating is referred to as a blazed grating. The diffraction efficiency of the grating is greatly improved due to the blaze.

Although the blazed grating has a lot of advantages, it is difficult to keep obtaining high diffraction efficiency in a broad waveband from an ultraviolet band to an infrared band. Therefore, the holographic bi-brazed grating realizes higher and uniform diffraction efficiency in the broad waveband. And the holographic bi-blazed grating has a broad market prospects due to its advantage of high efficiency in the broad waveband.

In Chinese patent application No. CN200910231737.3, a method for fabricating a holographic bi-blazed grating is disclosed. In the method, a grating with a blaze angle A is fabricated on a substrate firstly, then a region A is shielded, and then a grating with a blaze angle B is fabricated on a region B. Holographic ion beam etching is adopted in fabricating the two gratings, which includes: fabricating a photoresist grating mask on the surface, etching the mask with an tilted-ion beam to fabricate a triangle blazed grating on the substrate. The two blaze angles are fabricated by controlling the thicknesses of the photoresists on both of the regions A and B.

However, in the above method, the processes of coating photoresist and lithography are performed twice to form the two blaze angles of the grating. Besides, fabrication of the blaze angles A and B depends on a groove depth of the photoresist grating. It is difficult to precisely control a duty cycle, a groove shape and a depth of the grating which is formed by performing the lithography on the photoresist. In addition, in the case that the tilted-ion beam etching is performed, a difference between the materials of the photoresist and the substrate results in inconsistent etching rates, hence there is an error between the blaze angle of the blazed grating fabricated and an desired blaze angle, and it is difficult to precisely control the blaze angle.

Therefore, it is necessary to seek for a new method for fabricating a holographic bi-blazed grating to solve the above issue.

SUMMARY

In view of the above, the object of the present disclosure is to provide a method for fabricating a holographic bi-blazed grating in which two blaze angles are controlled precisely without performing a photoresist coating process and a lithography process twice. The two blaze angles of the holographic bi-blazed grating are blaze angles A and B respectively, and the bi-blazed grating is divided into two regions with a grating region A corresponding to the blaze angle A and a grating region B corresponding to the blaze angle B.

The fabricating method includes the following steps:

1) coating a photoresist layer on a substrate, where a thickness of the photoresist layer depends on the blaze angle A;

2) performing lithography on the photoresist layer to form a photoresist grating for fabricating the blaze angle A;

3) shielding the grating region B, performing tilted-Ar ion beam scanning etching on the substrate by using the photoresist grating as a mask to etch different portions of the substrate in the grating region A with an obscuring effect of the photoresist grating on the ion beam, to form a blazed grating with the blaze angle A;

4) shielding the grating region A, and performing vertical ion beam etching on the substrate in the grating region B by using the photoresist grating as a mask, to form a homogeneous grating in the grating region B by transferring the pattern of the photoresist grating onto the substrate, where a depth of the etching depends on the blaze angle B;

5) cleaning the substrate to remove remaining photoresist;

6) shielding the grating region A, performing tilted-Ar ion beam scanning etching on the substrate by using the homogeneous grating as a mask to etch different portions of the substrate in the grating region B with an obscuring effect of the homogeneous grating on the ion beam, to form a blazed grating with the blaze angle B; and 7) cleaning the substrate to obtain the bi-blazed grating with the two blaze angles.

Optionally, the vertical ion beam etching is Ar ion beam etching or $CHF_3$ reaction ion beam etching, and specific technological parameters of the vertical ion beam etching are that: in the case that the Ar ion beam etching is adopted, ion energy is in a range of 380 eV to 520 eV, an ion beam current is in a range of 70 mA to 140 mA, an accelerating voltage is in a range of 240V to 300V and a working pressure is $2.0 \times 10^{-2}$ Pa; and in the case that the $CHF_3$ reaction ion beam etching is adopted, the ion energy is in a range of 300 eV to 470 eV, the ion beam current is in a range of 70 mA to 140 mA, the accelerating voltage is in a range of 200V to 300V and the working pressure is $1.4 \times 10^{-2}$ Pa.

Optionally, a duty cycle of the photoresist grating is in a range of 0.25 to 0.6 and a period of the photoresist grating is in a range of 300 nm to 3000 nm.

Optionally, the photoresist grating is a rectangle grating or a sinusoidal-shaped grating.

Optionally, the homogeneous grating is a rectangle grating or a trapezoid grating.

Optionally, technological parameters of the tilted-Ar ion beam scanning etching are that: ion energy is in a range of 380 eV to 520 eV, an ion beam current is in a range of 70 mA to 140 mA, an accelerating voltage is in a range of 240V to 300V, an working pressure is $2.0 \times 10^{-2}$ Pa and an etching angle is in a range of 8 degrees to 40 degrees.

Optionally, a stripe board is used for shielding the grating region A or grating region B.

Optionally, before the Step 4), the method further includes performing an ashing process on the photoresist grating.

With the above technical solution, the present disclosure has advantages as follows compared with the existing technologies.

1. In the present disclosure, a step of fabricating a homogenous grating is introduced in fabricating a blaze angle B. In this way, the two different blaze angles may be fabricated by controlling the thickness of the photoresist grating mask in the grating region A and the thickness of the homogenous grating mask in the grating region B, respectively; and the second interference lithography is avoided.

2. The homogenous grating mask is formed by using vertical ion beam etching in the grating region B, the groove shape and groove depth of the homogenous grating may be controlled precisely, since the vertical ion beam etching has a good etching effect on the etching direction due to aeolotropism.

3. In the present disclosure, during the tilted-Ar ion beam etching, since the homogenous grating mask and the substrate are made of the same material, etching rates of the homogenous grating mask and the substrate keep consisting with each other. Hence, the blaze angle may be controlled precisely

BRIEF DESCRIPTION OF THE DRAWINGS

In order to explain the technical solutions in embodiments of the present invention or the conventional technology more clearly, accompanying drawings of the embodiments or the conventional technology are briefly illustrated hereinafter. Apparently, the accompanying drawings described hereinafter are only a few of embodiments of the present invention, and those skilled in the art can further conceive other drawings according to the drawings without creative work.

DETAILED DESCRIPTION

In the existing methods for fabricating a holographic bi-blazed grating, blaze angles A and B are fabricated by firstly fabricating a grating on photoresist and then performing tilted-ion beam etching by using the grating as a mask. And there are the following issues in the existing methods: firstly, the process of lithography needs to be performed twice; secondly, due to limitations of the technology of exposure and development, it is difficult to precisely control the groove shape and depth of the grating which is formed by performing the lithography; thirdly, in performing the tilted-ion beam etching, a difference between the materials of the photoresist and the substrate results in inconsistent etching rates thereof, hence there is an error between the blaze angle formed and an desired blaze angle and it is difficult to precisely control the blaze angle.

In the present disclosure, blaze angles A and B may be fabricated respectively by taking different gratings as masks on the grating regions A and B and twice of lithography are avoided. The blaze angle B is fabricated by firstly fabricating a homogenous grating by taking a photoresist grating as a mask, and then performing tilted-Ar ion beam scanning etching by taking the homogenous grating as a mask. Compared with the conventional art, in the present disclosure, during the fabrication of the homogenous grating mask, the groove shape and depth of the grating may be controlled by controlling a vertical ion beam etching. In addition, etching rates of the homogeneous grating mask and the substrate keep consisting with each other because the homogenous grating mask is fabricated by the same material with the substrate, therefore, the blaze angle may be controlled precisely.

Figure 1:
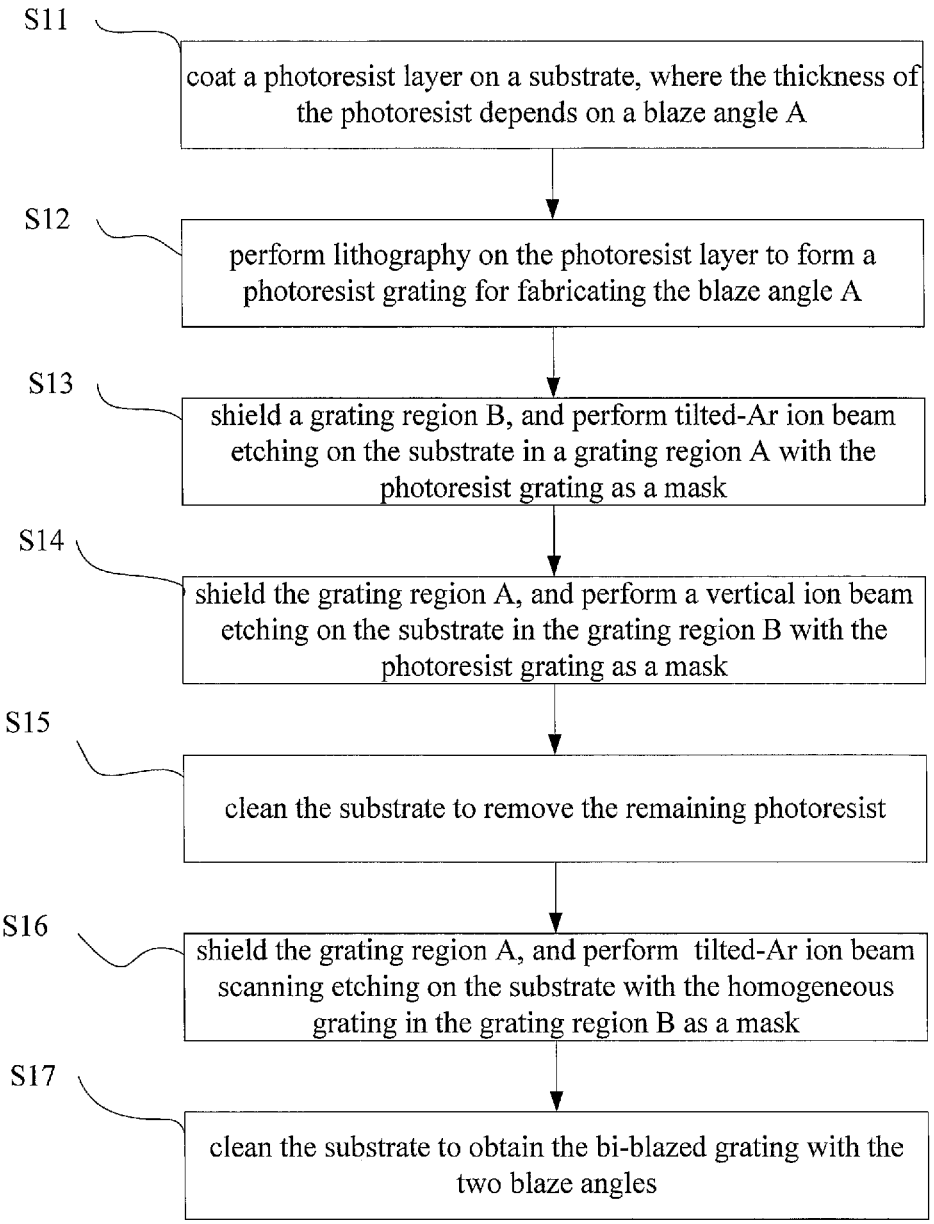
FIG. 1 is a flowchart of a method for fabricating a holographic bi-blazed grating according to the present invention.

Referring to FIG. 1, which is a flowchart of a method for fabricating a holographic bi-blazed grating according to the present disclosure. As shown in the figure, the flowchart of the method for fabricating the holographic bi-blazed grating according to the present disclosure includes steps S11 to S17.

Step S11 may include coating a photoresist layer on a substrate. Specifically, the technology for coating the photoresist layer may be spin coating or steam-coating. The photoresist layer may be a positive photoresist layer or a negative photoresist layer, which may depend on the subsequent different processes. And the thickness of the coated photoresist layer depends on a blaze angle A.

Step S12 may include performing lithography on the photoresist layer to form a photoresist grating to fabricate the blaze angle A. The lithography may be laser interference lithography or mask lithography, and the laser interference lithography is adopted in the present disclosure. Specifically, two or more beams of coherent light are formed by spiting light emitted from a laser source into multiple light paths, and the two or more beams of coherent light are converged on the surface of the photoresist layer by using a lens to form an interference pattern of light and dark regions. The property of the photoresist in the exposure region of the interference pattern changes. A surface relief grating structure is formed on the photoresist layer by developing.

Step S13 may include shielding the grating region B, performing tilted-Ar ion beam scanning etching on the substrate by using the photoresist grating as a mask to etch different portions of the substrate in the grating region A with the obscuring effect of the photoresist grating mask on the ion beam, to form a blazed grating with the blaze angle A. And specific technological parameters of the tilted-Ar ion beam scanning etching are that: ion energy is in a range of 380 eV to 520 eV, an ion beam current is in a range of 70 mA to 140 mA, an accelerating voltage is in a range of 240V to 300V and a working pressure is $2.0 \times 10^{-2}$ Pa.

Step S14 may include shielding the grating region A, and performing vertical ion beam etching on the substrate in grating region B by using the photoresist grating as a mask, to form a homogeneous grating in the grating region B by transferring the pattern of the photoresist grating onto the substrate, where the depth of the etching depends on a blaze angle B. Specifically, the vertical ion beam etching may be Ar ion beam etching or $CHF_3$ reaction ion beam etching, and specific technological parameters of the vertical ion beam etching are that: in the case of the Ar ion beam etching is adopted, ion energy is in a range of 380 eV to 520 eV, an ion beam current is in a range of 70 mA to 140 mA, an accelerating voltage is in a range of 240V to 300V and a working pressure is $2.0 \times 10^{-2}$ Pa; and in the case of the $CHF_3$ reaction ion beam etching is adopted, the ion energy is in a range of 300 eV to 470 eV, the ion beam current is in a range of 70 mA to 140 mA, the accelerating voltage is in a range of 200V to 300V and the wording pressure is $1.4 \times 10^{-2}$ Pa.

Step S15 may include cleaning the substrate to remove remaining photoresist. After the vertical ion beam etching is performed, there may be remaining photoresist on the substrate. It is cleaned by full reaction with a solution of mixture of sulfuric acid and oxidizing agent to expose the blazed grating in the grating region A and the homogenous grating in the grating region B.

Step S16 may include shielding the grating region A, performing tilted-Ar ion beam scanning etching on the substrate by using the homogeneous grating as a mask to etch different portions of the substrate in the grating region B with the obscuring effect of the homogeneous grating on the ion beam, to form a blazed grating with the blaze angle B. Specifically, technological parameters of the tilted-Ar ion beam scanning etching is that: the ion energy is in a range of 380 eV to 520 eV, the ion beam current is in a range of 70 mA to 140 mA, the accelerating voltage is in a range of 240V to 300V, the working pressure is $2.0 \times 10^{-2}$ Pa and an etching angle is in a range of 8 degrees to 40 degrees.

Step S17 may include cleaning the substrate to obtain the bi-blazed grating with the two blaze angles.

In step S11, the thickness of the photoresist layer is based on the blaze angles, which also may need to be determined during the fabrication of a common blazed grating.

Generally, blaze angle Os is relevant to the groove shape of the photoresist grating mask and an incident angle of the ion beam. Here, in the case that the photoresist grating mask is a rectangle grating mask, an empirical formula relevant to the blaze angle Os, the incident angle of the ion beam and the groove shape is given as follows: $\theta s \approx \alpha - 3$ degrees.

Figure 2:
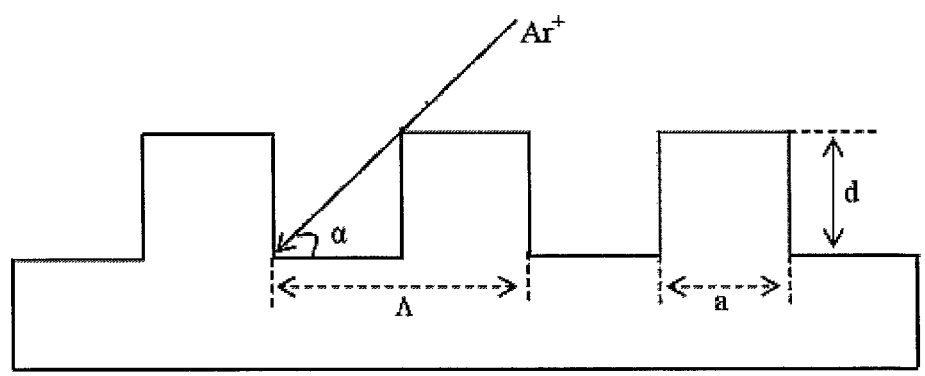
FIG. 2 is a diagram of a geometric relationship of a rectangle grating.

Referring to FIG. 2, the following formula may be obtained based on a geometric relationship between the incident angle of the ion beam $\alpha$, and parameters of a grating mask in FIG. 2:

$$tg\alpha = \frac{d}{\Lambda - a}.$$

It can be seen that the parameters of the photoresist grating mask may be different accordingly for different blaze angles. In the case that the period of the grating $\Lambda$, and the duty cycle of the grating $a/\Lambda$ are predetermined, different blaze angles are obtained by changing the thickness of the grating mask d. And those skilled in the art are capable of determining the thickness of the grating mask based on the blaze angles.

In step S14, the depth of the etching is based on the blaze angle, which also may need to be determined during the fabrication of a common blazed grating.

Generally, blaze angle $\theta s$ is relevant to the groove shape of the homogenous grating mask and the incident angle of the ion beam. Here, in the case that the homogenous grating mask is a rectangle grating mask, an empirical formula relevant to the blaze angle $\theta s$, the incident angle of the ion beam and the groove shape is given as follows: $\theta s \approx \alpha - 3$ degrees.

Similarly, for a rectangle homogenous grating, the following formula may be obtained based on the incident angle of the ion beam $\alpha$, and the parameters of the grating mask.

$$tg\alpha = \frac{d}{\Lambda - a}$$

It can be seen that parameters of the homogenous grating mask may be different accordingly for different blaze angles. In the case that the period of the grating $\Lambda$, and the duty cycle of the grating $a/\Lambda$ are predetermined, different blaze angles are obtained by changing the thickness of the grating mask d. And those skilled in the art are capable of determining the thickness of the grating mask based on the blaze angles.

In the above technical scheme, the grating structure fabricated by the interference lithography in step S12 has the period ($\Lambda$) ranging from 0.3 μm to 3 μm, the duty cycle ranging from 0.25 to 0.6; and the groove shape of the grating structure may be rectangular or sinusoidal.

In the above technical scheme, the grating structure fabricated by the vertical ion beam etching in step S14 has the period ($\Lambda$) ranging from 0.3 μm to 3 μm, the duty cycle ranging from 0.25 to 0.6; and the groove shape of the grating structure may be rectangle or trapezoid.

Optionally, before step S14, an ashing process is performed on the photoresist layer and the duration for the ashing process depends on the required duty cycle of the grating. Generally, the duty cycle of the grating structure formed by the lithography on the photoresist is approximately in a range of 0.5 to 0.6, and it is difficult to regulate the duty cycle of the grating with the lithography technology. Therefore, in the present disclosure, the duty cycle of the photoresist grating structure is regulated by the ashing technology. With the ashing technology, the duty cycle of the grating structure may be regulated efficiently in a range of 0.25 to 0.6.

In the following, the method for fabricating the holographic bi-blazed grating according to the present disclosure is described in detail with several specific embodiments. It should be understood that, parameters specified in the following embodiments only are several specific applications within the scope of protection of the present disclosure, but not intends to limit the scope of protection of the present disclosure.

First Embodiment

Figure 3:
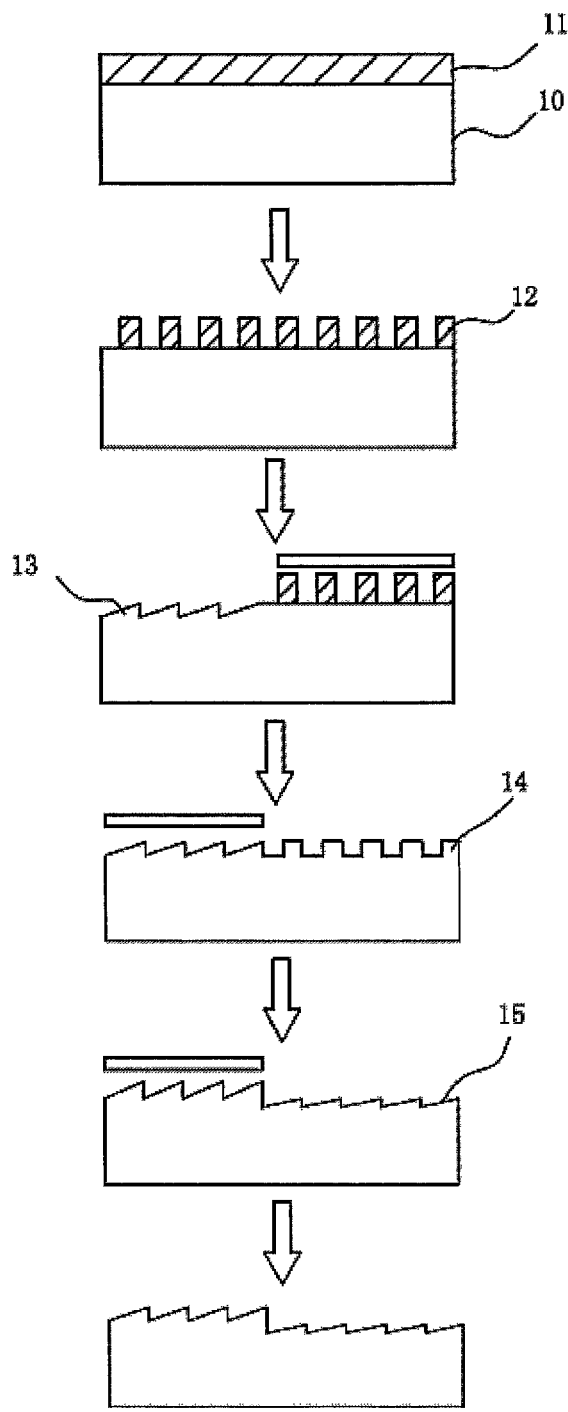
FIG. 3 is a schematic diagram of an effect corresponding to each step according to a first embodiment of the present invention.

Referring to FIG. 3, which is a schematic diagram of a status corresponding to each step in the first embodiment of the present invention, a holographic bi-blazed grating with a period of 833 nm and two blaze angles of 25 degrees and 10 degrees, is fabricated by adopting interference lithography, ion beam etching and tilted-ion beam scan etching. And the method for fabricating the grating includes steps as follows.

Step (1) may include coating a photoresist layer 11 on a substrate 10. Based on the requirement of the bi-blazed grating to be fabricated, that is, the period is 833 nm and the two blaze angles are respectively 25 degrees and 10 degrees; and based on the empirical formula relevant to the blaze angle θs, the incident angle of the ion beam and the groove shape may be expressed as: θs≈α−3 degrees.

Taking a rectangle photoresist grating (see FIG. 2) as an example, a grating with a blaze angle of 25 degrees (blaze angle Λ) is fabricated firstly. Generally, the duty cycle f of the photoresist grating is f=a/Λ=0.5, and based on the following formula:

$$tg\alpha = \frac{d}{\Lambda - a},$$

it is obtained that the groove depth of the grating mask d is 221 nm. In this embodiment, the photoresist layer with a depth of 230 nm is coated.

Step (2) may include performing interference lithography to fabricate a photoresist grating mask 12 conforming to the requirement of the blaze angle A.

Step (3) may include shielding a grating region B, performing titled-Ar ion beam scanning etching on different portions of the substrate 10 in a grating region A with the obscuring effect of the photoresist grating mask 12 on the ion beam, to form a triangle blazed grating 13. Here, the incident angle of the tilted-Ar ion beam may be expressed as: α=θs+3 degrees=28 degrees. The Ar ion beam etching is adopted with ion energy of 450 eV, an ion beam current of 100 mA, an accelerating voltage of 260V and a working pressure of 2.0×10$^{-2}$ Pa; and the duration for etching is set appropriately to etch the photoresist up.

Step (4) may include obtaining a depth of the etching required in fabricating a grating with a blaze angle of 10 degrees (blaze angle B) by taking the rectangle grating as an example. Generally, the duty cycle f of the photoresist grating is f=a/Λ=0.5, and based on the following formula:

$$tg\alpha = \frac{d}{\Lambda - a},$$

it is obtained that that the groove depth of the grating mask d is 96 nm. Therefore, the grating region A is shielded; vertical ion beam etching is performed on the grating region B, the pattern of the photoresist grating mask 12 is transferred onto the substrate by vertical ion beam etching to form a homogenous grating mask 14 of which the groove depth is 96 nm. Here, Ar ion beam etching is adopted with the ion energy of 450 eV, a ion beam current of 100 mA, an accelerating voltage of 260V and a working pressure of 2.0×10$^{-2}$ Pa.

Step (5) may include cleaning the substrate to remove the remaining photoresist.

Step (6) may include shielding the grating region A, performing tilted-Ar ion beam scanning etching on different portions of the substrate 10 in the grating region B with the obscuring effect of the homogenous grating mask 14 on the ion beam, to form a triangle blazed grating. Here, an incident angle of the ion beam may be expressed as: α=θs+3 degrees=13 degrees; the Ar ion beam etching is adopted with ion energy of 400 eV, a ion beam current of 100 mA, an accelerating voltage of 240V and a working pressure of 2.0×10$^{-2}$ Pa. And the duration for etching is set appropriately to etch the homogenous grating mask up, thereby an etched blazed grating 15 with the blaze angle of 10 degrees is obtained in the grating region B.

Step (7) may include cleaning the substrate to obtain the bi-blazed grating.

Second Embodiment

Figure 4:
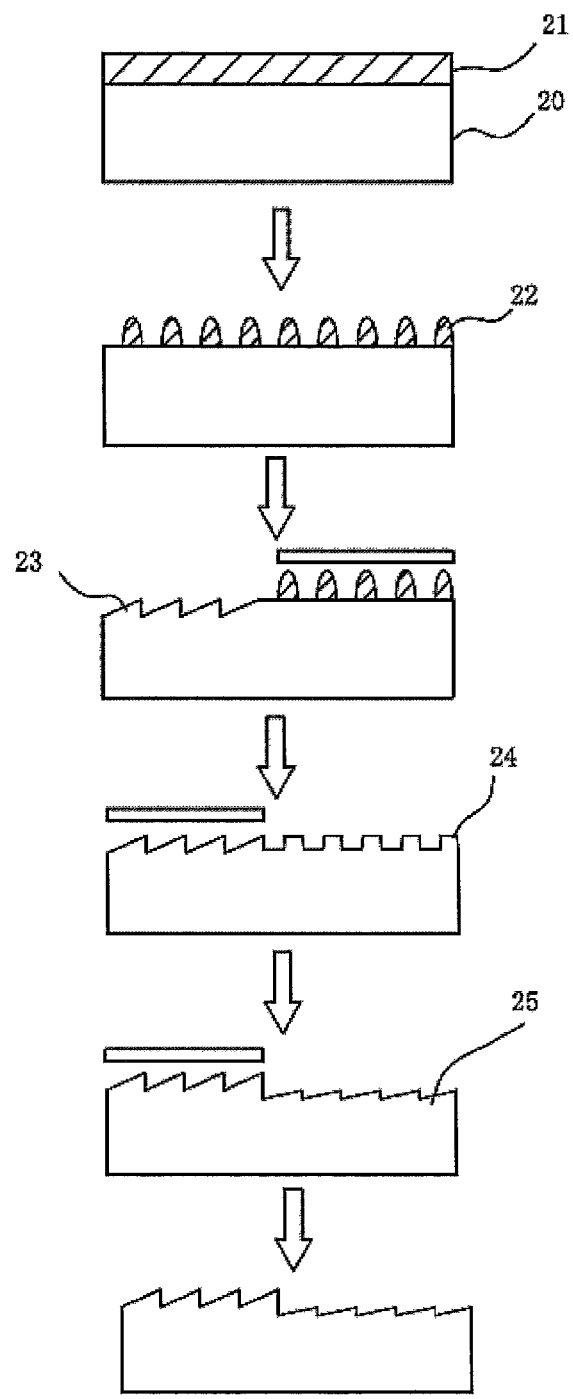
FIG. 4 is a schematic diagram of an effect corresponding to each step according to a second embodiment of the present invention.

Referring to FIG. 4, which is a schematic diagram of a status corresponding to each step in the second embodiment of the present invention, a holographic bi-blazed grating with a period of 1000 nm and two blaze angles of 25 degrees and 12 degrees is fabricated by adopting interference lithography, vertical ion beam etching and tilted-Ar ion beam scanning etching. And the method for fabricating the grating includes steps as follows.

Step (1) may include coating a photoresist layer 21 on a substrate 20. Based on the requirement of the bi-blazed grating to be fabricated, that is, the period is 1000 nm and the two blaze angles are respectively 25 degrees and 12 degrees; and based on the empirical formula relevant to the blaze angle θs, the incident angle of the ion beam and the groove shape may be: θs≈α−3 degrees.

Figure 5:
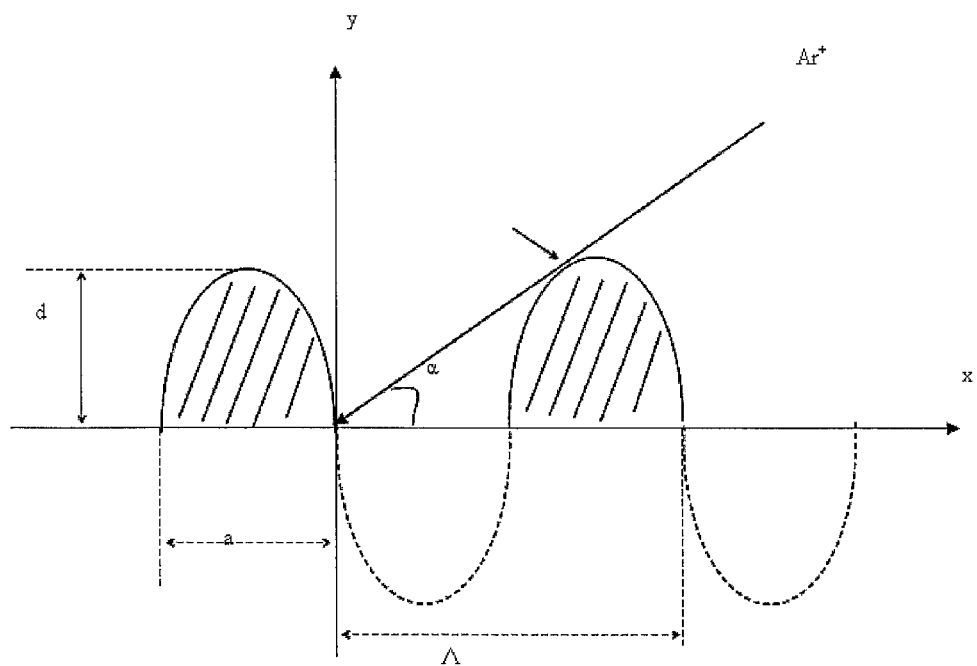
FIG. 5 is a diagram of a geometric relationship of a sinusoidal-shaped grating.

Taking a sinusoidal-shaped photoresist grating (see FIG. 5) as an example, a grating with a blaze angle of 25 degrees (blaze angle A) is fabricated firstly. The duty cycle f of the photoresist grating is f=a/Λ=0.5, and the profile of the grating may be expressed by the following formula:

$$\gamma = -d \times \sin(2\pi x/\Lambda)$$

a tangent shown in the figure passes through the origin, and Λ/2<x<(¾)Λ, the following equation may be obtained by calculation:

$$tg\alpha = \frac{y_0}{x_0} = 1.365 \frac{d}{\Lambda},$$

and it may be obtained that a groove depth of the grating mask d is 389 nm. Hence, the photoresist layer with a depth of 400 nm is coated.

Step (2) may include performing interference lithography to fabricate a photoresist grating mask 22 conforming to the requirement of the blaze angle A.

Step (3) may include shielding a grating region B, performing tilted-Ar ion beam scanning etching on different portions of the substrate 20 in a grating region A with the obscuring effect of the photoresist grating mask 22 on the ion beam, to form a triangle blazed grating 23. Here, the incident angle of the ion beam may be expressed as: α=θs+3 degrees=28 degrees. The Ar ion beam etching is adopted with ion energy of 450 eV, an ion beam current of 100 mA, an accelerating voltage of 260V and a working pressure of 2.0×10$^{-2}$ Pa; and the duration for the etching is set appropriately to etch the photoresist up.

Figure 6:
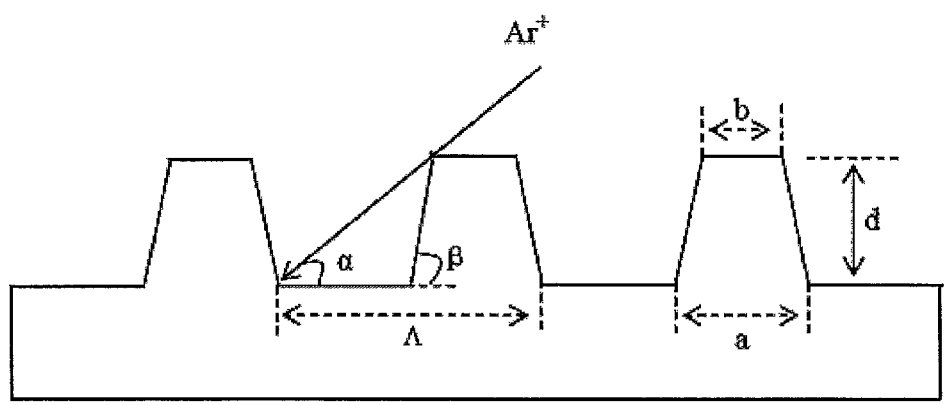
FIG. 6 is a diagram of a geometric relationship of a trapezoid grating.

Step (4) may include obtaining an etching depth required in fabricating a grating with a blaze angle of 12 degrees (blaze angle B) by taking a trapezoid grating as an example (see FIG. 6). Generally, the duty cycle f of the photoresist grating is f=a/Λ=0.5, and a trapezoidal angle β is 80 degrees. And based on the following formula:

$$tg\alpha = \frac{d}{\Lambda \times (1-f) + \frac{d}{tg\beta}},$$

it is obtained that the groove depth of the grating mask d is 141 nm. Therefore, the grating region A is shielded; vertical ion beam etching is performed on the grating region B, the pattern of the photoresist grating mask is transferred onto the substrate by ion beam etching to form a homogenous grating mask 24 of which the groove depth is 141 nm. Here, CHF3 reaction ion beam etching is adopted with the ion energy of 400 eV, an ion beam current of 100 mA, the accelerating voltage of 240V and the wording pressure of $1.4×10^{-2}$ Pa.

Step (5) may include cleaning the substrate to remove the remaining photoresist.

Step (6) may include shielding the grating region A, performing tilted-Ar ion beam scanning etching on different portions of the substrate in the grating region B with the obscuring effect of the homogenous grating mask 24 on the ion beam, to form a triangle blazed grating. Here, the incident angle of the ion beam may be expressed as: $\alpha=\theta s+3$ degrees=15 degrees; the Ar ion beam etching is adopted with the ion energy of 450 eV, the ion beam current of 100 mA, the accelerating voltage of 260V and the working pressure of $2.0×10^{-2}$ Pa. And the duration for etching is set appropriately to etch the homogenous grating mask up, thereby an etched blazed grating 25 with the blaze angle of 12 degrees is obtained in the grating region B.

Step (7) may include cleaning the substrate to obtain the bi-blazed grating

Third Embodiment

Figure 7:
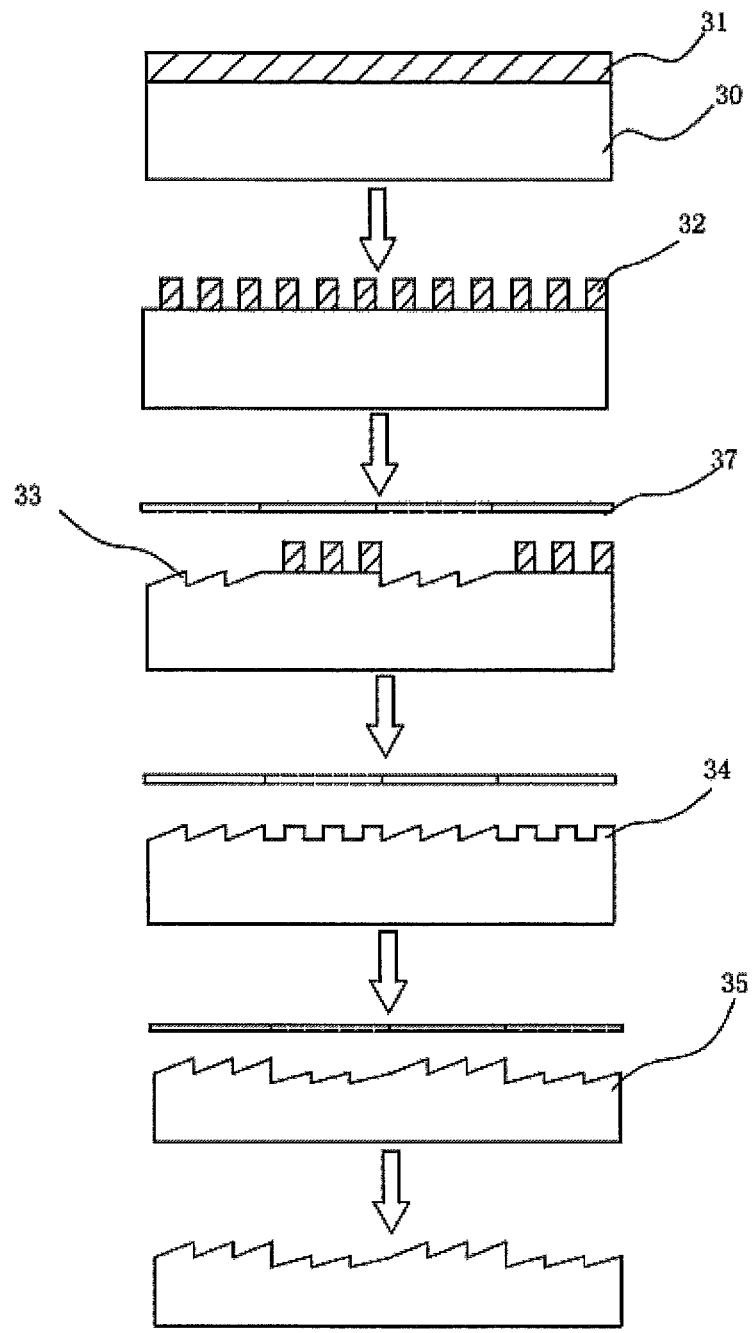
FIG. 7 is a schematic diagram of an effect corresponding to each step according to a third embodiment of the present invention.

Referring to FIG. 7, which is a schematic diagram of a status corresponding to each step according to the third embodiment of the present invention. In this embodiment, regions A and B respectively corresponding to two blaze angles of a bi-blazed grating are alternately distributed as shown in FIG. 7 by using a stripe board 37 for shielding. A holographic bi-blazed grating with a period of 500 nm and two blaze angles of 20 degrees and 10 degrees, is fabricated by employing interference lithography, ion beam etching and tilted-ion beam scanning etching. And the method for fabricating the grating includes steps as follows.

Step (1) may include coating a photoresist layer 31 on a substrate 30. Based on the requirement of the bi-blazed grating to be fabricated, that is, the period (Λ) is 500 nm and two blaze angles are respectively 20 degrees and 10 degrees; and based on the empirical formula relevant to the blaze angle θs, the incident angle of the ion beam and the groove shape may be: $\theta s \approx \alpha - 3$ degrees.

Taking a rectangle photoresist grating as an example, a grating with a blaze angle of 20 degrees (blaze angle A) is fabricated firstly. Generally, the duty cycle f of the photoresist grating is f=a/Λ=0.5, and based on the following formula:

$$tg\alpha = \frac{d}{\Lambda - a},$$

it is obtained that the grove depth of the grating mask (d) is 106 nm. Therefore, the photoresist layer with a depth of 110 nm is coated.

Step (2) may include performing interference lithography to fabricate a photoresist grating mask 32 conforming to the requirement of the blaze angle A.

Step (3) may include shielding a grating region B, performing tilted-Ar ion beam scanning etching on different portions of the substrate in a grating region A with the obscuring effect of the photoresist grating mask 32 on the ion beam, to form a triangle blazed grating 33. Here, the incident angle of the ion beam may be expressed as: $\alpha=\theta s+3$ degrees=23 degrees. The Ar ion beam etching is adopted with ion energy of 450 eV, an ion beam current of 100 mA, an accelerating voltage of 260V and a working pressure of $2.0×10^{-2}$ Pa; and the duration for etching is set appropriately to etch the photoresist up. Here the distribution of the formed grating regions A and B depend on the pattern distribution on the stripe board 37. For example, the width of the hollow portion on the stripe board 37 is 10 mm and the space between the hollow portions is 10 mm, the formed grating regions A and B are alternately distributed with the width of 10 mm, and a structure in which ABAB . . . is formed.

Step (4) may include obtaining an etching depth required in fabricating a grating with a blaze angle of 10 degrees (blaze angle B) by taking the trapezoid grating as an example. Generally, the duty cycle f of the photoresist grating is f=a/Λ=0.5, and a trapezoidal angle β is 80 degrees. And based on the following formula:

$$tg\alpha = \frac{d}{\Lambda \times (1-f) + \frac{d}{tg\beta}},$$

it is obtained that the groove depth of the grating mask (d) is 60 nm. Therefore, on the grating region B, the pattern of the photoresist grating mask 32 is transferred onto the substrate by ion beam etching, to form a homogenous grating mask 34 of which the groove depth is 60 nm. Here, Ar ion beam etching is adopted with ion energy of 450 eV, a ion beam current of 100 mA, an accelerating voltage of 240V and the working pressure of $2.0×10^{-2}$ Pa.

Step (5) may include cleaning the substrate to remove the remaining photoresist.

Step (6) may include shielding the grating region A, performing tilted-Ar ion beam scanning etching on different portions of the substrate 30 in the grating region B with the obscuring effect of the homogeneous grating mask 34 on the ion beam, to form a triangle blazed grating. Here, the incident angle of the ion beam may be expressed as: $\alpha=\theta s+3$ degrees=13 degrees; the Ar ion beam etching is adopted with ion energy of 450 eV, a ion beam current of 100 mA, an accelerating voltage of 260V and a working pressure of $2.0×10^{-2}$ Pa. And the duration for etching is set appropriately to etch the homogenous grating mask up, thereby an etched blazed grating 35 with the blaze angle of 10 degrees is obtained in the grating region B.

Step (7) may include cleaning the substrate to obtain the bi-blazed grating.

Fourth Embodiment

Figure 8:
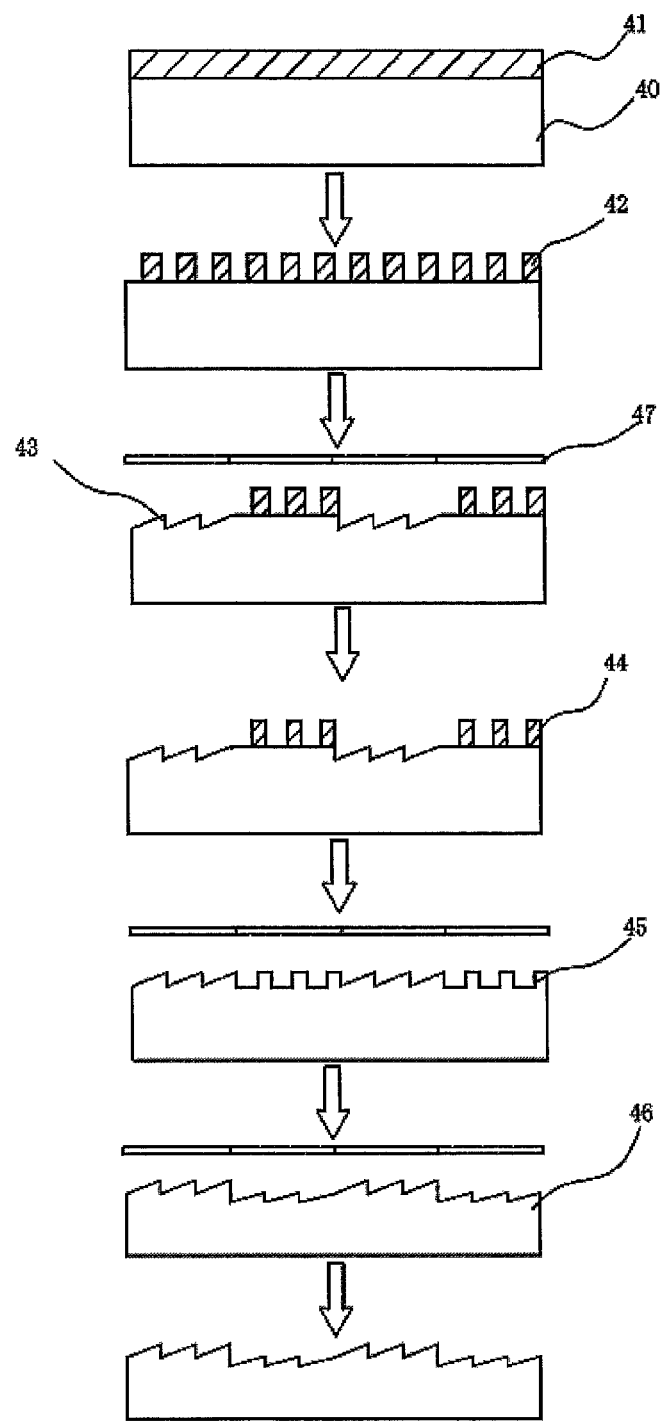
FIG. 8 is a schematic diagram of an effect corresponding to each step according to a fourth embodiment of the present invention.

Referring to FIG. 8, which is a schematic diagram of a status corresponding to each step in the fourth embodiment of the present invention. In this embodiment, regions A and B respectively corresponding to two blaze angles of a bi-blazed grating are alternately distributed by using a stripe board 47 for shielding. A holographic bi-blazed grating with a period of 500 nm and two blaze angles of 20 degrees and 10 degrees is fabricated by employing interference lithography, ion beam etching and tilted-ion beam scanning etching. And the method for fabricating the grating includes steps as follows.

Step (1) may include coating a photoresist layer 41 on a substrate 40. Based on the requirement of the bi-blazed grating to be fabricated, that is, the period (Λ) is 500 nm and two blaze angles are respectively 20 degrees and 10 degrees; and based on the empirical formula relevant to the blaze angle Os, the incident angle of the ion beam and the groove shape may be: θs≈α−3 degrees.

Taking a rectangle photoresist grating as an example, a grating with a blaze angle of 20 degrees (blaze angle A) is fabricated firstly. Generally, the duty cycle f of the photoresist grating is f=a/Λ=0.5, and based on the following formula:

$$tg\alpha = \frac{d}{\Lambda - a},$$

it is obtained that the grove depth of the grating mask (d) is 106 nm. Therefore, the photoresist layer with a depth of 110 nm is coated.

Step (2) may include performing interference lithography to fabricate a photoresist grating mask 42 conforming to the requirement of the blaze angle A.

Step (3) may include shielding a grating region B, performing tilted-Ar ion beam scanning etching on different portions of the substrate in a grating region A with the obscuring effect of the photoresist grating mask 42 on the ion beam, to form a triangle blazed grating 43. Here, the incident angle of the ion beam may be expressed as: α=θs+3 degrees=23 degrees. The Ar ion beam etching is employed with ion energy of 450 eV, an ion beam current of 100 mA, an accelerating voltage of 260V and a working pressure of 2.0×10⁻² Pa; and the duration for etching is set appropriately to etch the photoresist up. Here the distribution of the formed grating regions A and B depends on the pattern distribution on the stripe board 37. For example, the width of the hollow portion on the stripe board 37 is 3 mm and the space between the hollow portions is 3 mm, the formed grating regions A and B are alternately distributed with the width of 3 mm, and a structure in which ABAB . . . is formed.

Step (4) may include obtaining an etching depth required in fabricating a grating with a blaze angle of 10 degrees (blaze angle B) and the duty cycle of f=a/Λ by taking the rectangle grating as an example. The duty cycle of the photoresist grating mask 42 may be regulated by introducing an ashing process before vertical ion beam etching, to form a new photoresist grating mask 44 with a duty cycle of 0.35. In a specific technology, the photoresist grating is etched by oxygen reactive etching in a reactive ion etcher, where a radio power is 45 W, a self-bias is 300V and a working pressure is 1.0 Pa. Then, based on the following formula:

$$tg\alpha = \frac{d}{\Lambda - a}$$

it is obtained that the groove depth of the grating mask d is 75 nm. Therefore, on the grating region B, the pattern of the photoresist grating mask 44 is transferred onto the substrate 40 by ion beam etching, to form a homogenous grating mask 45 of which the groove depth is 75 nm. Here, Ar ion beam etching is adopted with ion energy of 450 eV, an ion beam current of 100 mA, an accelerating voltage of 260V and a working pressure of 2.0×10⁻² Pa.

Step (5) may include cleaning the substrate to remove the remaining photoresist.

Step (6) may include shielding the grating region A, performing tilted-Ar ion beam scanning etching on different portions of the substrate 40 in the grating region B with the obscuring effect of the homogeneous grating mask 45 on the ion beam, to form a triangle blazed grating. Here, the incident angle of the ion beam may be expressed as: α=θs+3 degrees=13 degrees; the Ar ion beam etching is adopted with ion energy of 450 eV, an ion beam current of 100 mA, an accelerating voltage of 260V and a working pressure of 2.0×10⁻² Pa. And the duration for etching is set appropriately to etch the homogenous grating mask up, thereby an etched blazed grating 46 with the blaze angle of 10 degrees is obtained in the grating region B.

Step (7) may include cleaning the substrate to obtain the bi-blazed grating.

In all the above embodiments, the material of the substrate may be silica glass, K9 glass or other transparent optical materials.

In summary, in a method for fabricating a holographic bi-blazed grating provided in the present disclosure, on a grating region A, a photoresist grating acts as a mask for titled-ion beam etching, and on grating region B, a homogenous grating acts as a mask for tilted-ion beam etching. Therefore, two blaze angles are controlled separately. The present disclosure has features as follows when compared with the existing technologies.

1. In the present disclosure, a step of fabricating a homogenous grating is introduced in fabricating a blaze angle B. In this way, the two different blaze angles may be fabricated by controlling the thickness of the photoresist grating mask in the grating region A and the thickness of the homogenous grating mask in the grating region B, respectively; and a second interference lithography is avoided.

2. The homogenous grating mask is formed by using vertical ion beam etching on the grating region B, the groove shape and groove depth of the homogenous grating may be controlled precisely, since the vertical ion beam etching has a good etching effect on the etching direction due to aeolotropism.

3. In the present disclosure, during the tilted-Ar ion beam etching, since the homogenous grating mask and the substrate are made of the same material, etching rates of the homogenous grating mask and the substrate keep consisting with each other. Hence, the blaze angle may be controlled precisely.

The description of the embodiments herein enables those skilled in the art to implement or use the present disclosure. Numerous modifications to the embodiments will be apparent to those skilled in the art, and the general principle herein can be implemented in other embodiments without deviation from the spirit or scope of the present disclosure. Therefore, the present disclosure will not be limited to the embodiments described herein, but in accordance with the widest scope consistent with the principle and novel features disclosed herein.

The invention claimed is:

1. A method for fabricating a holographic bi-blazed grating, wherein: two blaze angles of the holographic bi-blazed grating are respectively a blaze angle A and a blaze B, and the bi-blazed grating is divided into two regions with a grating region A corresponding to the blaze angle A and a grating region B corresponding to the blaze angle B; the fabricating method comprises the following steps:
  1) coating a photoresist layer on a substrate, wherein a thickness of the photoresist layer depends on the blaze angle A;
  2) performing lithography on the photoresist layer to form a photoresist grating for fabricating the blaze angle A;
  3) shielding the grating region B, performing tilted-Ar ion beam etching on the substrate by using the photoresist grating as a mask to etch different portions of the substrate in the grating region A with an obscuring effect of the photoresist grating mask on the ion beam, to form a blazed grating with the blaze angle A;

4) shielding the grating region A, and performing vertical ion beam etching on the substrate in the grating region B by using the photoresist grating as a mask, to form a homogeneous grating in the grating region B by transferring a pattern of the photoresist grating, wherein a depth of the etching depends on the blaze angle B;

5) cleaning the substrate to remove remaining photoresist;

6) shielding the grating region A, performing tilted-Ar ion beam scanning etching on the substrate by using the homogeneous grating as a mask to etch different portions of the substrate in the grating region B with an obscuring effect of the homogeneous grating on the ion beam, to form a blazed grating with the blaze angle B; and 7) cleaning the substrate to obtain the bi-blazed grating with the two blaze angles.

2. The method for fabricating the holographic bi-blazed grating according to claim 1, wherein the vertical ion beam etching is Ar ion beam etching or $CHF_3$ reaction ion beam etching, and specific technological parameters of the vertical ion beam etching are that: in the case of the Ar ion beam etching is adopted, ion energy is in a range of 380 eV to 520 eV, an ion beam current is in a range of 70 mA to 140 mA, an accelerating voltage is in a range of 240V to 300V and a working pressure is $2.0 \times 10^{-2}$ Pa; and in the case of the $CHF_3$ reaction ion beam etching is adopted, the ion energy is in a range of 300 eV to 470 eV, the ion beam current is in a range of 70 mA to 140 mA, the accelerating voltage is in a range of 200V to 300V and the working pressure is $1.4 \times 10^{-2}$ Pa.

3. The method for fabricating the holographic bi-blazed grating according to claim 1, wherein a duty cycle of the photoresist grating is in a range of 0.25 to 0.6 and a period of the photoresist grating is in a range of 300 nm to 3000 nm.

4. The method for fabricating the holographic bi-blazed grating according to claim 1, wherein the photoresist grating is a rectangle grating or a sinusoidal-shaped grating.

5. The method for fabricating the holographic bi-blazed grating according to claim 1, wherein the homogeneous grating is a rectangle grating or a trapezoid grating.

6. The method for fabricating the holographic bi-blazed grating according to claim 1, wherein technological parameters of the tilted-Ar ion beam scanning etching are that: ion energy is in a range of 380 eV to 520 eV, an ion beam current is in a range of 70 mA to 140 mA, an accelerating voltage is in a range of 240V to 300V, an working pressure is $2.0 \times 10^{-2}$ Pa and an etching angle is in a range of 8 degrees to 40 degrees.

7. The method for fabricating the holographic bi-blazed grating according to claim 1, wherein a stripe board is used for shielding the grating region A or grating region B.

8. The method for fabricating the holographic bi-blazed grating according to claim 1, wherein before the Step 4), the method further comprises performing an ashing process on the photoresist grating.

* * * * *